United States Patent [19]

Yamazaki

[11] Patent Number: 5,416,718
[45] Date of Patent: May 16, 1995

[54] CIRCUIT DESIGN SUPPORT SYSTEM AND CIRCUIT PRODUCING METHOD

[75] Inventor: Masami Yamazaki, Kawasaki, Japan

[73] Assignee: Fujitsu Limited, Kanagawa, Japan

[21] Appl. No.: 940,278

[22] Filed: Sep. 3, 1992

[30] Foreign Application Priority Data

Sep. 5, 1991 [JP] Japan ................................ 3-226012

[51] Int. Cl.$^6$ ............................................. G06F 15/60
[52] U.S. Cl. ................................. 364/488; 364/491; 395/921
[58] Field of Search ............... 364/488, 490, 491, 578; 395/919, 920, 921, 922, 923

[56] References Cited

U.S. PATENT DOCUMENTS

| | | | |
|---|---|---|---|
| 4,484,292 | 11/1984 | Hong et al. | 364/491 |
| 4,698,760 | 10/1987 | Lembach et al. | 364/490 |
| 4,922,432 | 5/1990 | Kobayashi et al. | 364/490 |
| 5,034,899 | 7/1991 | Schult | 364/518 |
| 5,046,017 | 9/1991 | Yuyama et al. | 364/491 |
| 5,105,374 | 4/1992 | Yoshida | 364/578 |
| 5,119,314 | 6/1992 | Hotta et al. | 364/491 |
| 5,168,455 | 12/1992 | Hooper | 364/490 |
| 5,173,864 | 12/1992 | Watanabe et al. | 364/491 |
| 5,191,542 | 3/1993 | Murofushi | 364/491 |
| 5,208,764 | 5/1993 | Rusu et al. | 364/491 |
| 5,208,768 | 5/1993 | Simoudis | 364/578 |
| 5,210,700 | 5/1993 | Tom | 364/489 |
| 5,218,551 | 6/1993 | Agrawal et al. | 364/491 |
| 5,251,147 | 10/1993 | Finnerty | 364/490 |
| 5,282,148 | 1/1994 | Poirot et al. | 364/491 |

Primary Examiner—Kevin J. Teska
Assistant Examiner—Tan Nguyen
Attorney, Agent, or Firm—Nikaido, Marmelstein, Murray & Oram

[57] ABSTRACT

In a circuit design support system, a logic minimizing unit receives data indicating a functional specification of a desired circuit and minimizes logical sequences of the desired circuit. A cell assignment unit assigns cells to each of minimized logical sequences determined by the logic minimizing unit and generates data on a circuit configuration of the desired circuit. The cells are logic units. A load/timing check unit receives the data on the circuit configuration and simultaneously executes a load check and a timing check. The load check determines whether or not the circuit configuration has a load driving ability within a tolerable load driving ability. The timing check determines whether or not the circuit configuration has a delay time of a signal within a tolerable delay time. A load adjustment unit executes a load adjustment of the circuit configuration on the basis of a result of the load check so that the load driving ability of the circuit configuration falls within the tolerable driving ability. A timing adjustment unit executes a timing adjustment of the circuit configuration on the basis of a result of the timing check so that the delay time of the circuit configuration falls within the tolerable delay time.

7 Claims, 10 Drawing Sheets

CIRCUIT DESIGN SUPPORT SYSTEM AND CIRCUIT PRODUCING METHOD

BACKGROUND OF THE INVENTION

1. Field of the Invention

The present invention generally relates to circuit design support systems, such as computer-aided design systems, and more specifically a circuit design system which designs a circuit on the basis of a functional specification thereof.

2. Description of the Related Art

Generally, it is required that a circuit, such as a large-scale integrated circuit, has a minimum number of gates and be produced at a minimum cost in a state in which the circuit has a time delay within a tolerable range and has an ability sufficient to drive a tolerable load. Generally, a circuit having a minimized scale has a larger number of logical stages, and hence longer delay times. A circuit capable of operating at a high speed has a large scale.

With the above in mind, a conventional circuit design method minimizes the scale of a desired circuit first, and performs, second, a timing check intended to determine whether or not a circuit having a minimized scale has delay times within a tolerable range. If a circuit portion having a delay time exceeding the tolerable range is identified, the circuit having the minimized scale is adjusted in order to reduce the delay time related to the above circuit portion.

Recent logic devices, such as computers and communications devices, have advanced functions and larger circuit scales. Under such circumstances, logic circuit design is becoming more complex. Hence, it is desired that a circuit design support system capable of efficiently designing desired circuits be provided.

Figure 1:
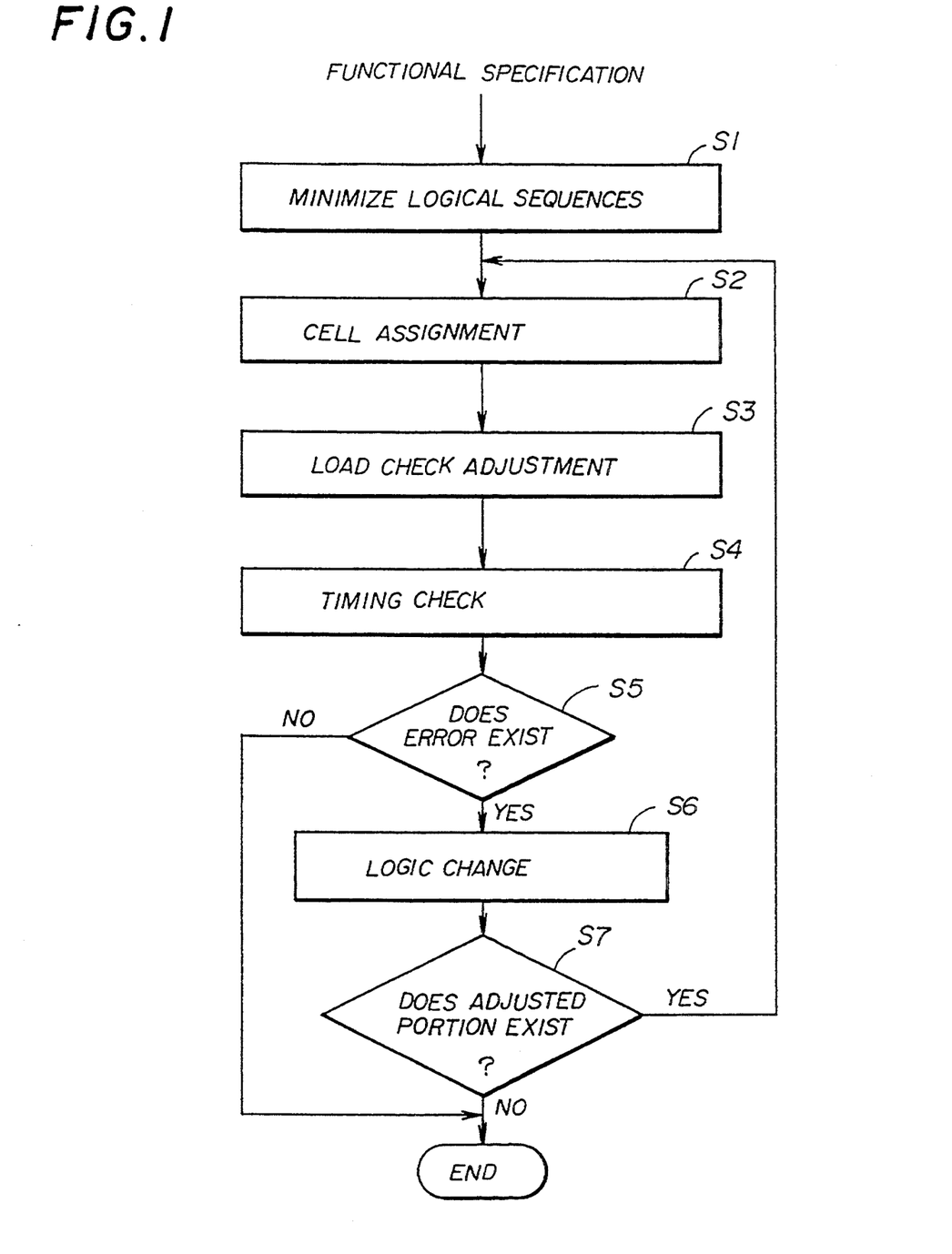
FIG. 1 is a flowchart of a related circuit design support method.

FIG. 1 is a flowchart of a related circuit design method executed by a related circuit design support system. Functional specification data indicating logical expressions and truth tables, are applied to the system. In step S1, the system minimizes the logical sequences of a desired circuit. In step S2, the system assigns cells (circuit elements) to the respective minimized logical sequences.

When step S2 is completed, the desired circuit is automatically created.

Figure 2:
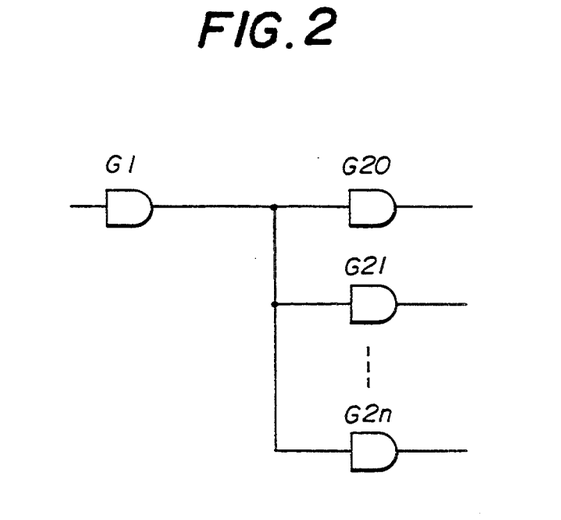
FIG. 2 is a block diagram for explaining a load check.

In step S3, the system executes a load check and a load adjustment based on the load check. The load check is intended to check how many gates are connected to a gate. As shown in FIG. 2, where (n+1) gates G20–G2n (where n is an integer) are connected to a gate G1, there is no problem if the fan-out number of the gate G1 is equal to or larger than n+1. However, if the gate G1 has a fan-out number smaller than n+1, the gate G1 does not operate and load adjustment is needed.

Figure 3:
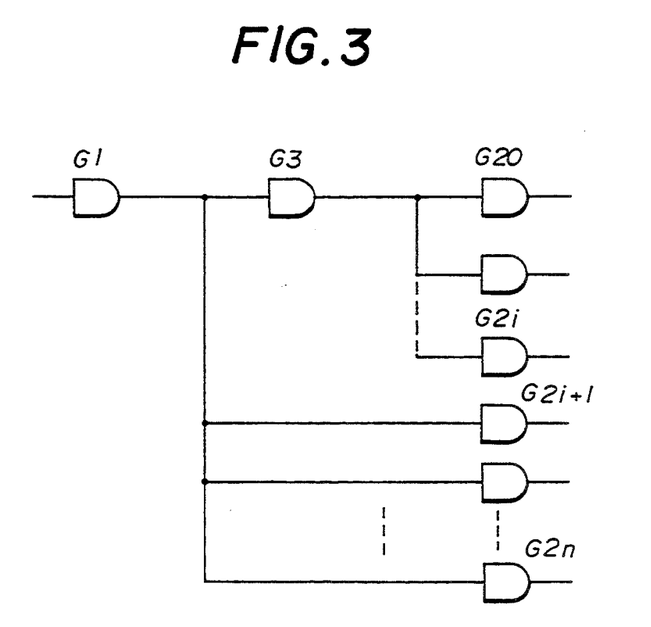
FIG. 3 is a block diagram for explaining a load adjustment.

The load adjustment is performed, as shown in FIG. 3. A buffer G3 is connected to the output terminal of the gate G1. The buffer G3 drives gates G20–G2i among the gates G20–G2n, and the gate G1 drives the remaining gates G2i+1–G2n. The gate G1 shown in FIG. 3 has a fan-out number within the specification.

In step S4, the system carries out a timing check. The timing check is intended to check whether or not the delay time of a gate including a signal line falls within a tolerable range. A signal transfer delay time Td between an input terminal i and output terminal x of a circuit element is approximately expressed as follows:

$$Td = Tix + C \cdot K \quad (1)$$

where Tix denotes a basic delay time between the input terminal i and output terminal x of the element, C denotes a load capacitance coupled to the output terminal x, and K denotes a delay time coefficient dependent on the load connected to the output terminal. The basic delay time Tix and the delay time coefficient are registered in a library unit provided in the circuit design support system.

The load capacitance C of the output terminal x is expressed as follows:

$$Cw = Cx + Ci \quad (2)$$

where Cw denotes a net wiring line capacitance coupled to the output terminal x and proportional to the length of a wiring line, and Ci is the total input load capacitance of an input terminal of an element connected to the output terminal x.

Generally, where the circuit element being considered is a CMOS element, the term $C \cdot K$, dependent on the load capacitance in the expression (1), is approximately equal to the basic delay time Tix when the circuit element being considered drives three to five input terminals of other elements connected to the output terminal x, although the term $C \cdot K$ depends on the types of the other elements. It can be seen from the above that the influence of the output load is great, as compared to the basic delay time Tix.

After the timing check in step S4, the system determines, in step S5, whether or not there is a timing error. The timing error means that the delay time Td defined in the expression (1) exceeds a rated delay time. If there is no timing error, the system ends the process shown in FIG. 1. If there is a timing error, the system executes, in step S6, a change process in which, for example, the number of logical stages is reduced to decrease the delay time Td. In step S7, the system determines whether or not there is an adjusted circuit portion. When the determination result is NO, the system ends the process. When the result of the determination in step S7 is YES, the system returns to step S2.

However, the related circuit design support process shown in FIG. 1 has a disadvantage in that the load check is executed in step S3 without taking into account the timing check, that is, time delays. In other words, the load check and timing check are separately carried out without taking each other into account. The related circuit design support process did not have a serious problem when circuits which do not have large scales are designed. However, recent computers and communications devices need circuits having very large scales. In this regard, a change in the logical structure, such as a reduction in the number of logical stages, needs an increased number of gates. With the above in mind, it is preferable that the logical structure be adjusted taking into the timing condition during the load check and adjustment process.

SUMMARY OF THE INVENTION

It is a general object of the present invention to provide a circuit design support system capable of efficiently performing load adjustment and timing adjustment.

This object of the present invention is achieved by a circuit design support system comprising: logic minimizing means for receiving data indicating a functional specification of a desired circuit and for minimizing logical sequences of the desired circuit; cell assignment means, operatively coupled to the logic minimizing means, for assigning cells to each of minimized logical sequences determined by the logic minimizing means and for generating data on a circuit configuration of the desired circuit, the cells being logic units; load/timing check means, operatively coupled to the cell assignment means, for receiving the data on the circuit configuration and for simultaneously executing a load check and a timing check, the load check determining whether or not the circuit configuration has a load driving ability within a tolerable load driving ability, the timing check determining whether or not the circuit configuration has a delay time of a signal within a tolerable delay time; load adjustment means, operatively coupled to the load/timing check means, for executing a load adjustment of the circuit configuration on the basis of a result of the load check so that the load driving ability of the circuit configuration falls within the tolerable driving ability; and timing adjustment means, operatively coupled to the load/timing check means, for executing a timing adjustment of the circuit configuration on the basis of a result of the timing check so that the delay time of the circuit configuration falls within the tolerable delay time.

Another object of the present invention is to provide a circuit producing method capable of efficiently performing load adjustment and timing adjustment.

This object of the present invention is achieved by a circuit producing method comprising the steps of: (a) receiving data indicating a functional specification of a desired circuit and minimizing logical sequences of the desired circuit; (b) assigning cells to each of minimized logical sequences determined by the step (a) and generating data on a circuit configuration of the desired circuit, the cells being logic units; (c) receiving the data on the circuit configuration and simultaneously executing a load check and a timing check, the load check determining whether or not the circuit configuration has a load driving ability within a tolerable load driving ability, the timing check determining whether or not the circuit configuration has a delay time of a signal within a tolerable delay time; (d) executing a load adjustment of the circuit configuration on the basis of a result of the load check so that the load driving ability of the circuit configuration falls within the tolerable driving ability; and (e) executing a timing adjustment of the circuit configuration on the basis of a result of the timing check so that the delay time of the circuit configuration falls within the tolerable delay time.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 4:
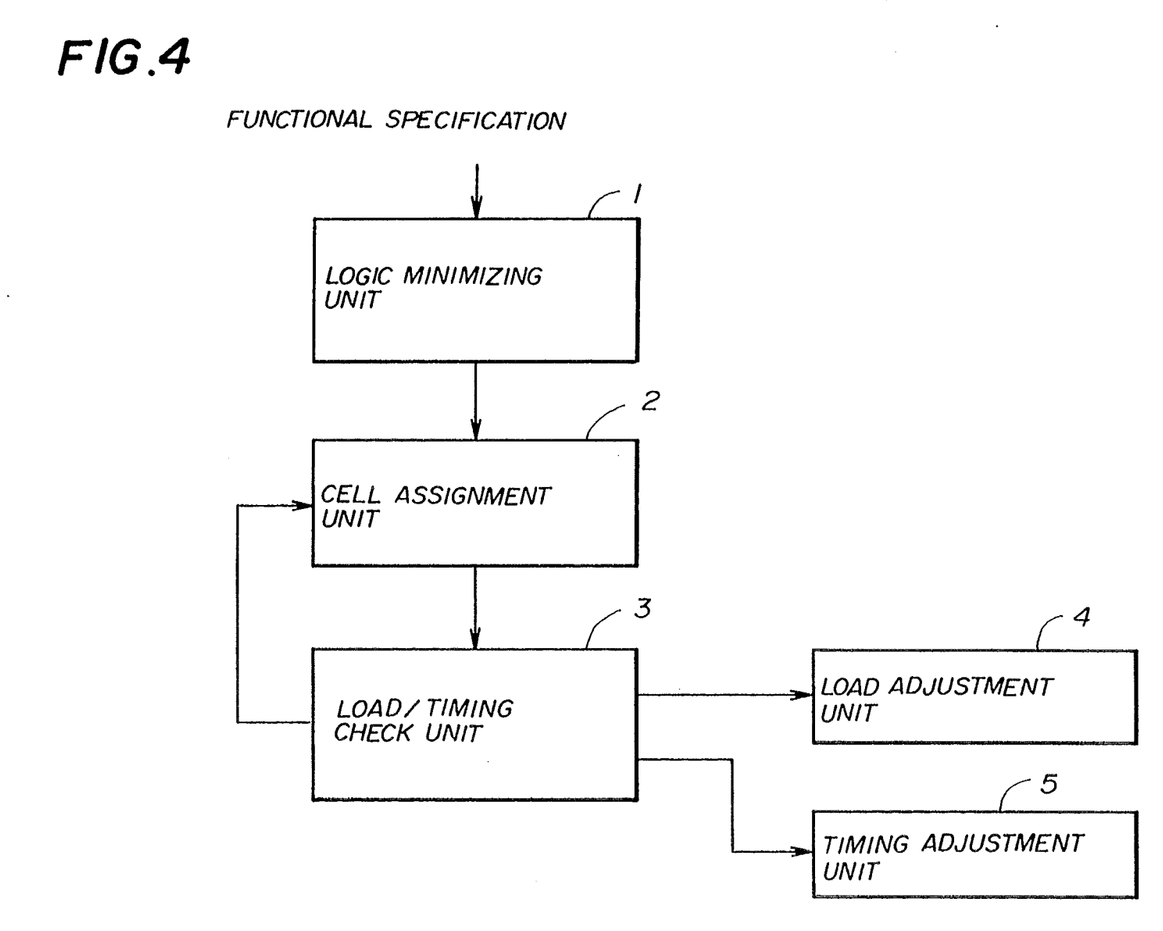
FIG. 4 is a block diagram showing an overview of the present invention.

FIG. 4 is a block diagram showing an overview of a circuit design support system according to an embodiment of the present invention. The system shown in FIG. 4 comprises a logic minimizing unit 1, a cell assignment unit 2, a load/timing check unit 3, a load adjustment unit 4, and a timing adjustment unit 5. The logic minimizing unit 1 inputs data indicating a functional specification of a desired circuit, such as logical expressions, and truth tables, and minimizes the logical sequences of the desired circuit. The cell assignment unit 2 receives output signals of the logic minimizing unit 1, and assigns cells to each of the minimized logical sequences. The load/timing check unit 3 receives output signals of the cell assignment unit 2, and simultaneously executes a load check and a timing check. The load adjustment unit 4 receives output signals of the load/timing check unit 3, and executes a load adjustment. The timing adjustment unit 5 receives output signals of the load/timing check unit 3, and executes a timing adjustment.

As will be described in detail later, the load/timing check unit 3 identifies an element having an overload, and calculates the delay time of the above element. That is, the load/timing check unit 3 checks the circuit determined by the cell assignment unit 2 in terms of both the load check and the timing check. In other words, the load/timing check unit 3 executes the load check taking into account the timing check. Hence, it becomes possible to efficiently perform the load adjustment and the timing adjustment.

Figure 5:
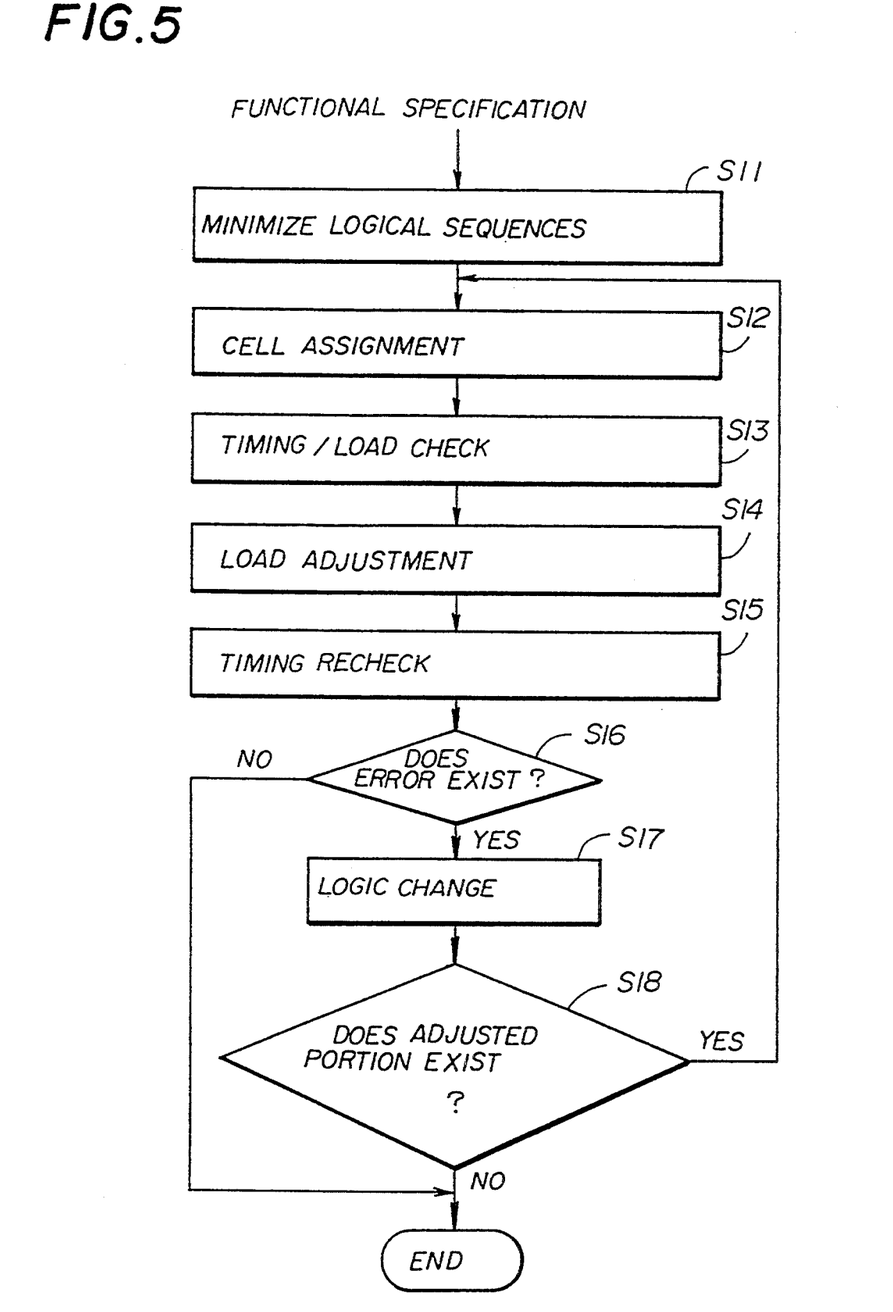
FIG. 5 is a flowchart showing an embodiment of the present invention.

FIG. 5 is a flowchart of a circuit design support method according to an embodiment of the present invention. In step S11, the logic minimizing unit 1 receives data indicating the functional specification of a desired circuit, and minimizes the logical sequences of the desired circuit. In step S12, the cell assignment unit 2 assigns cells (circuit elements) to each of the minimized logical sequences. In step S13, the timing/load check unit 3 simultaneously carries out the load check and the timing check for a circuit created by the cell assignment unit 2. After the load check and the timing check are completed, in step S14 the load adjustment unit 4 adjusts a load adjustment based on the check results outputted by the load/timing check unit 3. The load adjustment is carried out, as shown in FIG. 3. After the timing adjustment, the timing/load check unit 3 executes the timing check again in step S15. In the timing adjustment in step S15, the aforementioned expression (1) is used.

In step S16, the load/timing check determines whether or not a timing error has occurred. When it is determined that there is no timing error, the circuit created by the cell assignment unit 2 has no problem, and the process shown in FIG. 5 is ended. If it is determined that there is a timing error, in step S17 the load/timing check unit 3 executes a change process in which the number of logical stages is reduced, for example. In step S18, the load/timing check unit 3 determines whether or not the change process needs an adjustment of the logical structure of the circuit being considered. When the result of the determination in step S18 is YES, the load/timing check unit 3 causes the cell assignment unit 2 to carry out the cell assignment process for the logical sequences including an adjusted logic.

In order to calculate delay times in the circuit created by the cell assignment unit 2 in step S13, the following should be considered when a delay time of an element having an overload is calculated. The overload element has a load exceeding a tolerable load, and hence the load capacitance C in the expression (1) has a large value. On the other hand, according to the aforementioned related art, the load adjustment is carried out and then the timing adjustment is carried out. That is, the load capacitance C does not have a value as large as that of the above overload element.

Figure 6:
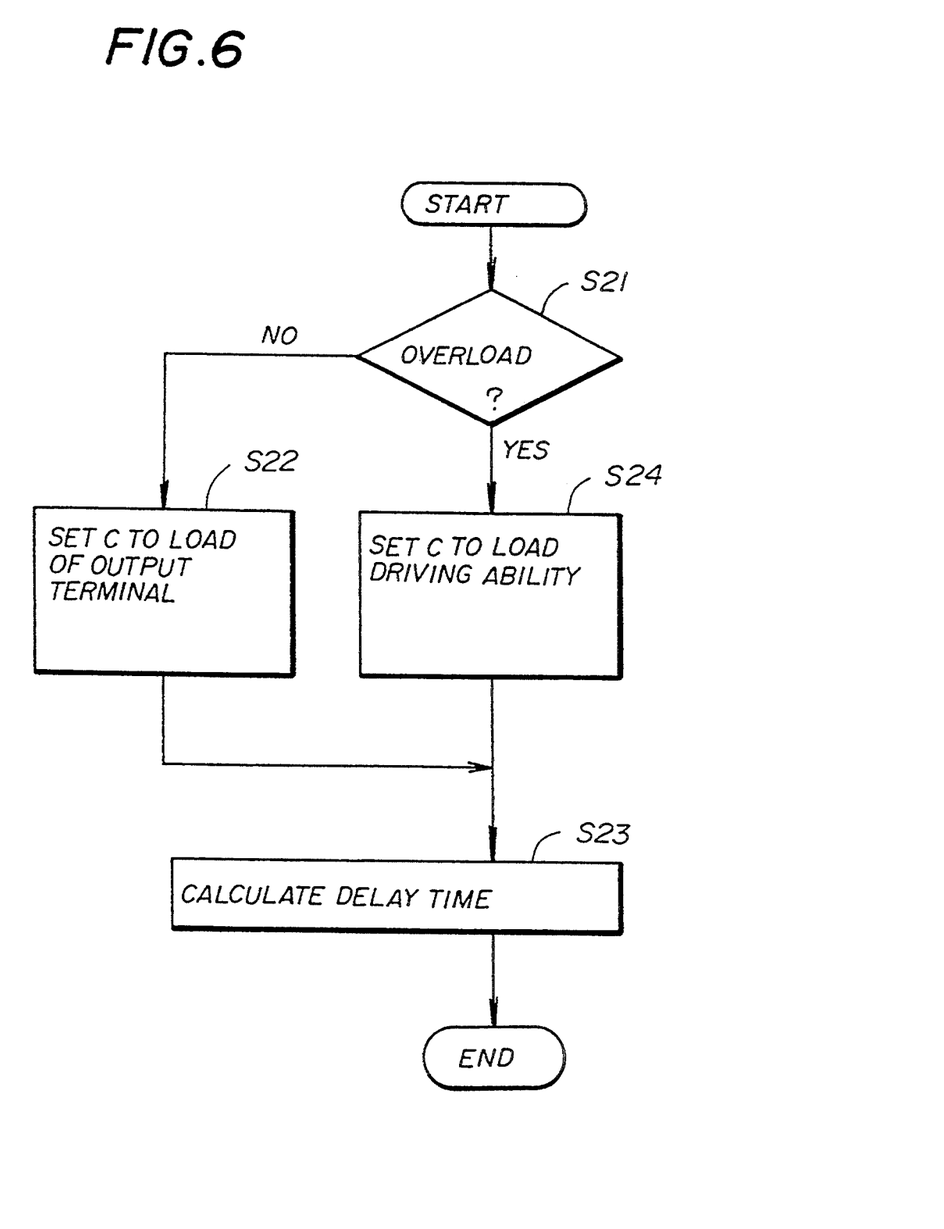
FIG. 6 is a flowchart showing a delay time calculation process according to the embodiment of the present invention.

With the above in mind, a delay time between an input terminal of an element and an output terminal thereof is calculated by the load/timing check unit 3, as shown in FIG. 6. In step S21, the load/timing check unit determines whether or not an element being considered has an overload. When the result of the determination in step S21 is NO, in step S22 the load/timing check unit 3 writes the load capacitance of the output terminal into the load capacitance C in the expression (1). In step S23, the load/timing check unit 3 calculates the delay time using the expression (1).

If it is determined that the element being considered has an overload, in step S24 the load/timing check unit 3 sets a rated maximum driving ability into the load capacitance C. Then, the load/timing check unit 3 calculates the delay time in step S23. By using the sequence shown in FIG. 6, it becomes possible to prevent the load capacitance C from having an excessively large value.

The timing adjustment unit 5 operates as follows. Where the timing adjustment is carried out for a combination circuit (which does not include a storage element), the delay time of each of all paths connecting external input terminals of the combination circuit and external output terminals thereof is calculated, and is then compared with a tolerable delay time. If it is determined that the delay time of a path exceeds the tolerable delay time, the combination circuit is an error. In this case, the logical structure of the combination circuit is adjusted so that the identified error is eliminated.

There is a possibility that there are a plurality of paths connecting an input terminal and an output terminal. If some paths have respective delay times exceeding the tolerable delay time, these paths are called critical signal paths.

The timing adjustment can be carried out for a sequential circuit (which is a logic circuit including a storage element) in the same manner as the timing adjustment to the combination circuit except for the following. The sequential circuit has not only the external input and output terminals but also internal input and output terminals of flip-flops. That is, the delay times of paths connecting the internal input and output paths are calculated for the sequential circuit.

The load adjustment unit 4 operates as follows. The load adjustment is based on information concerning overload error and information concerning critical paths.

Figure 7:
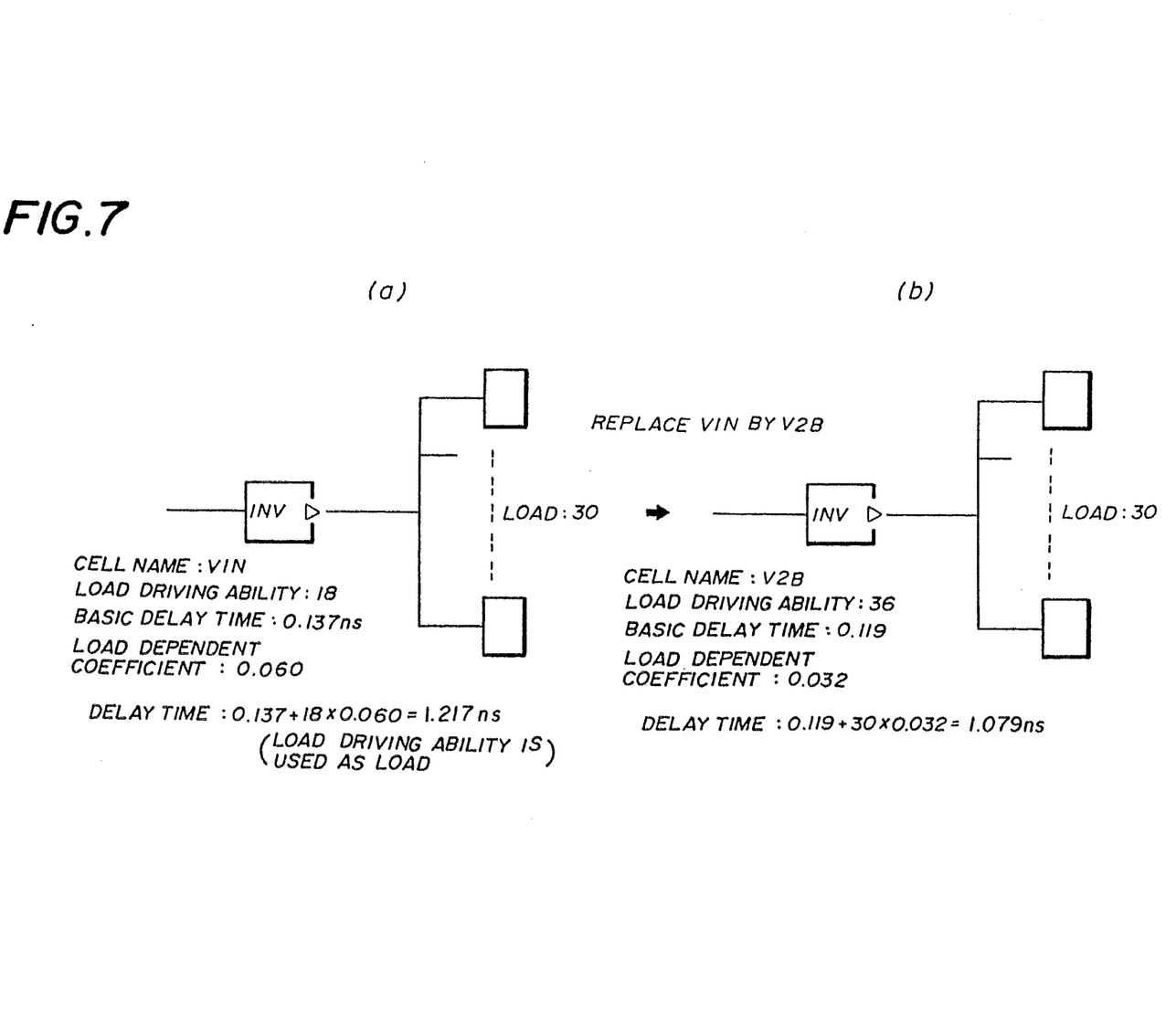
FIG. 7 is a diagram showing a first example of a load adjustment according to the embodiment of the present invention.

FIG. 7 shows an example of the load adjustment executed by the load adjustment unit 4. The example shown in FIG. 7 relates to a case where there is an element having the same function as an overload element and having a load driving ability equal to or larger than a tolerable load driving ability. As will be described below, the overload element is replaced by the element having the substitute element.

FIG. 7(a) shows a cell having a cell name V1N which is an inverter and has a load driving ability (fan-out number) equal to 18. As shown in FIG. 7(a), 30 loads are connected to the cell V1N. If the basic delay time Tix is equal to 0.137 ns, and the load dependent coefficient K is equal to 0.0060, the delay time Td is obtained from the expression (1) as follows:

$$Td = 0.137 + 18 \times 0.060 = 1.217 \text{ ns}.$$

In this calculation, the load driving ability of the cell V1N is used as a load thereof.

It will now be assumed that the cell V1N is replaced by a cell having a cell name V2B (which is an inverter) having a fan-out number of 36 in order to improve the situation shown in FIG. 7(a). If the basic delay time Tix of the cell V2B is equal to 0.119 and the load dependent coefficient K is equal to 0.032, the delay time Td is equal to 0.215 ns. It can be seen from the above that the replacement of the cell V1N with the cell V2B reduces the delay time.

Figure 8:
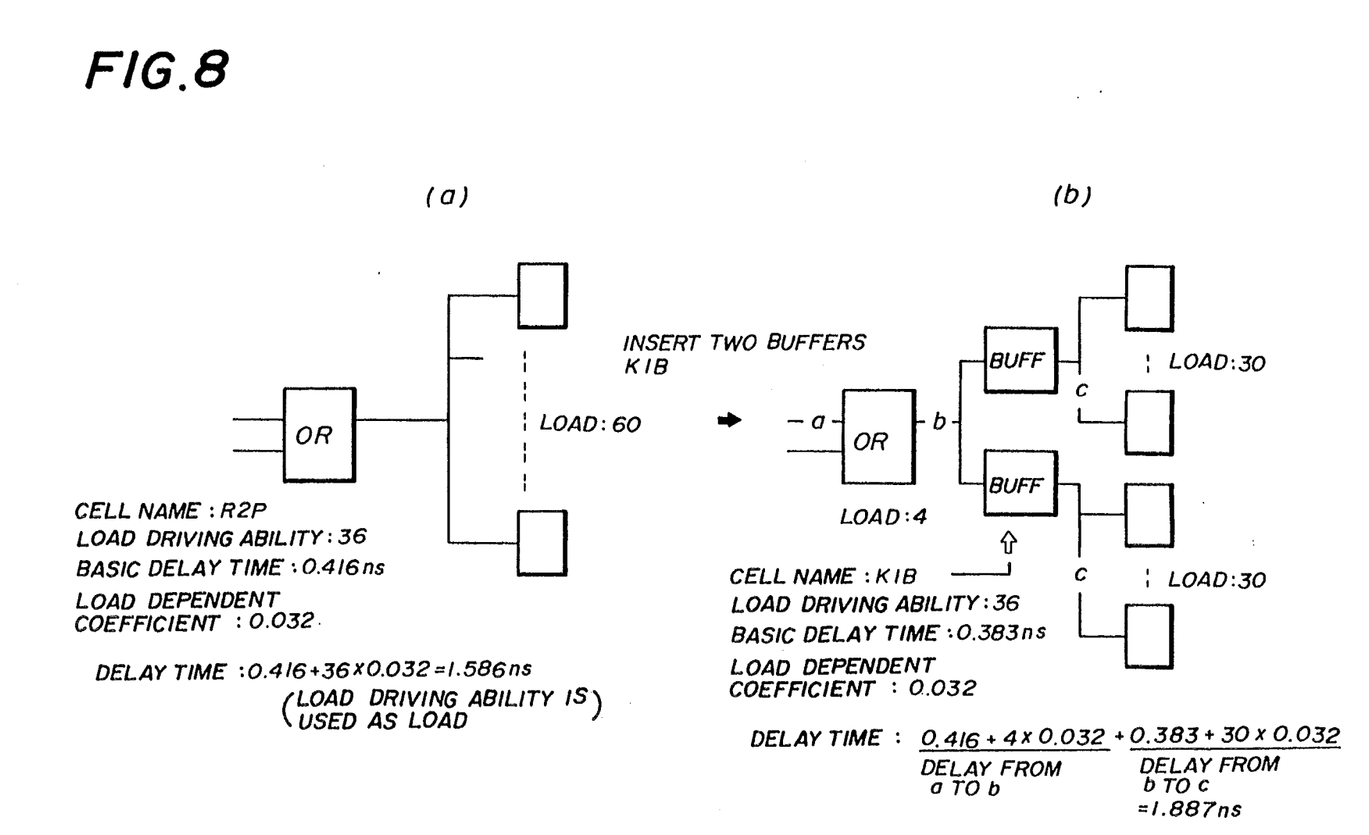
FIG. 8 is a diagram showing a second example of the load adjustment according to the related circuit design support method.

FIG. 8 shows a conventional load adjustment. The load adjustment shown in FIG. 8 relates to a case where a necessary number of buffers are connected to the output terminal of an overload element to thereby enhance the load driving ability. As shown in FIG. 8(a), an overload element having a cell name R2P (OR gate) has a load driving ability equal to 36, while 60 loads are connected to the output terminal of the overload element. If the basic delay time Tix of the cell R2P is equal to 0.416 ns, and the load dependent coefficient K is equal to 0.032, the delay time Td is obtained using the expression (1) as follows:

$$Td = 0.416 + 36 \times 0.032 = 1.568 \text{ ns}.$$

A circuit shown in FIG. 8(b) includes two buffers having a cell name K1B connected to the output terminal of the overload cell R2P. Each of the two buffers K1B drives 30 respective loads. If the basic delay time Tix = 0.382 ns, and the load dependent coefficient K = 0.032, the delay time Td is calculated from the expression (1) as follows:

$$Td = 0.416 + 4 \times 0.032 + 0.383 + 30 \times 0.032 = 1.887 \text{ ns}.$$

The term $(0.416 + 4 \times 0.032)$ indicates a delay time between a and b shown in FIG. 8(b), and the term $0.383 + 30 \times 0.032$ indicates a delay time between b and c. It can be seen from the above that there is no improvement in the delay time due to use of the buffers K1B.

It will be noted that the load adjustment as shown in FIG. 7 improves the delay time Td because an element having a high load driving ability has a small load dependent coefficient. The load adjustment as shown in FIG. 8 increases the delay time amounting to the number of loads inserted into the circuit.

Figure 9:
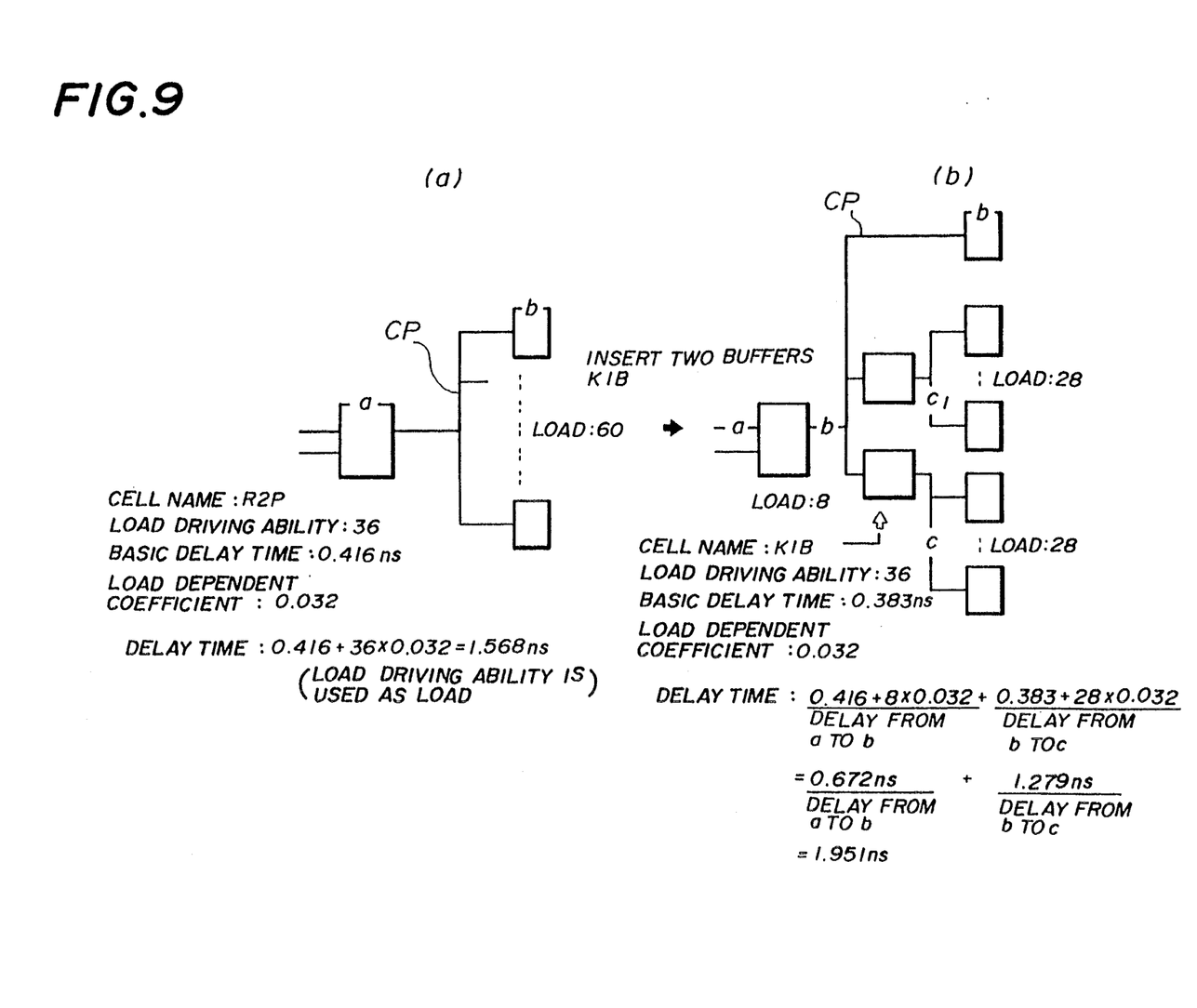
FIG. 9 is a diagram showing the second example of the load adjustment according to the embodiment of the present invention.

According to the present invention, the load adjustment is carried out for the configuration having the overload element R2P shown in FIG. 8(a), while the delay time of a critical path is reduced if such a critical path is available. This load adjustment taking into reduction of delay time will be carried out as shown in FIG. 9.

FIG. 9(a) shows an element a having a cell name R2P having a load driving ability equal to 36. The cell R2P shown in FIG. 9(a) drives 60 loads. That is, the cell R2P has an overload. If the basic delay time Tix of the cell R2P is equal to 0.416 ns, and the load dependent coefficient K is equal to 0.032, the delay time Td of each critical path CP is obtained as follows:

$$Td = 0.416 + 36 \times 0.032 = 1.568 \text{ ns}.$$

FIG. 9(b) shows a circuit in which the element R2P drives two buffers K1B and a single critical path CP. As shown in FIG. 9(b), 28 loads are respectively connected to the buffers K1B. Each of the buffers K1B has a load driving ability equal to 36° and hence it is easy for each of the buffers K1B to drive 28 loads. The delay time Td is the sum of the delay time between a and b, and the delay time between b and c. The delay time between a and b is 0.672 ns, and the delay time between b and c is 1.279 ns. Hence, the total delay time Td is 1.951 ns. Though the delay time of the circuit shown in FIG. 9(b) is larger than that of the circuit shown in FIG. 9(a), the delay time of the critical path CP shown in FIG. 9(b) is 0.672 ns, which is much smaller than that of each critical path CP shown in FIG. 9(a).

Figure 10:
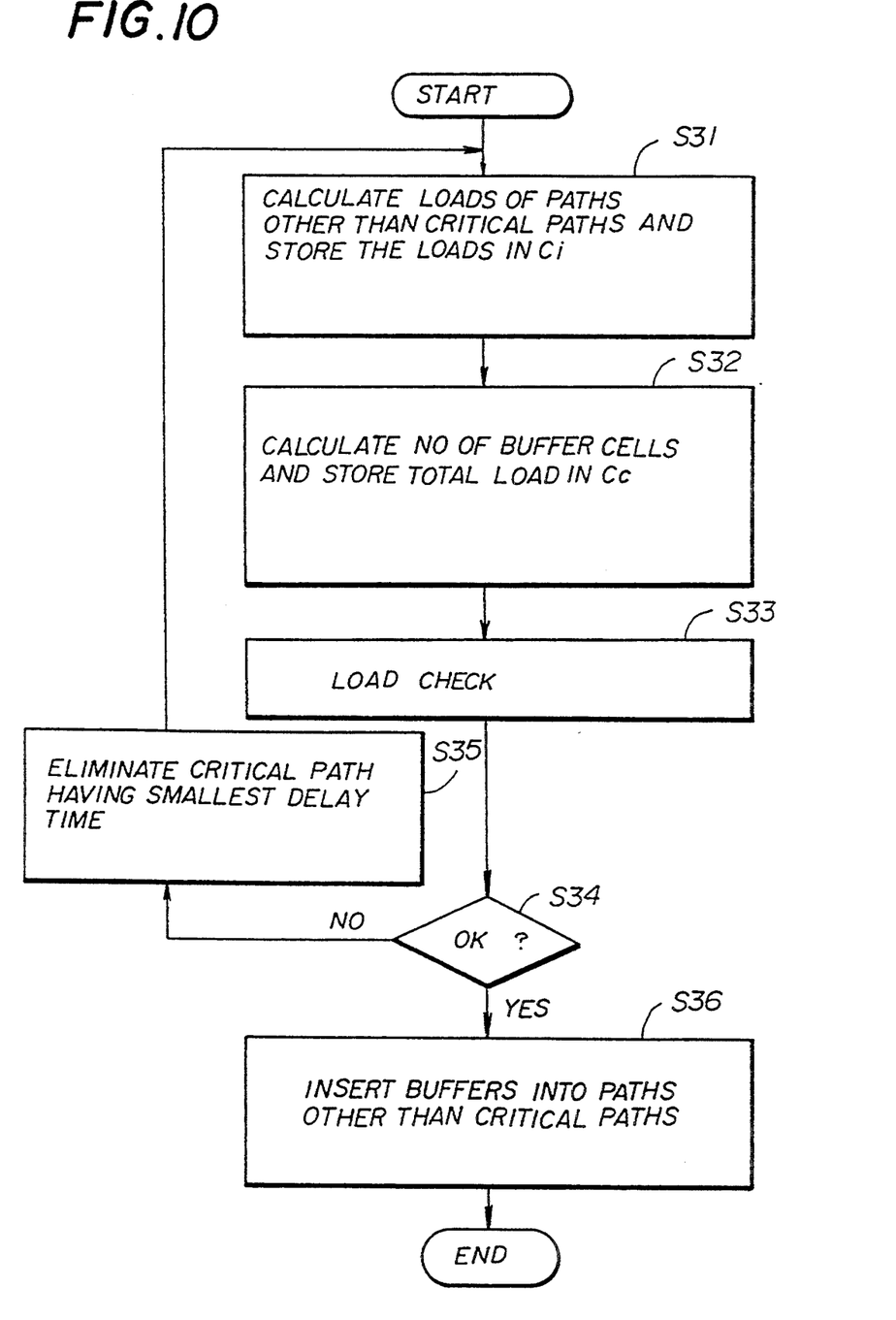
FIG. 10 is a flowchart showing a load adjustment process according to the embodiment of the present invention.

FIG. 10 is a flowchart of the above-mentioned load adjustment process according to the embodiment of the present invention. The process shown in FIG. 10 is executed under control of the load adjustment unit 4. In step S31, the loads of paths other than critical paths are calculated, and written into the term Ci. As has been described previously, the term Ci denotes the total of the load capacitances of input terminals of elements connected to the element being considered.

In step S32, the number of buffer cells necessary to drive the load Ci is calculated. Further, in step S32, the total of the load Ci and the loads of the critical paths is calculated and written into a variable Cc. In step S33, it is determined whether or not the load Cc is equal to or greater than the load driving ability of the overload element being considered. If it is determined that the load driving ability of the overload element is equal to or greater than the load Cc, buffers are provided in paths other than the critical paths in step S36. If it is determined the load driving ability of the overload element is smaller than the load Cc, one critical path having the smallest delay time is eliminated from all the critical paths in step S35, and step S31 is executed again. The steps S34 and S35 are repeatedly carried out until the result of the determination in step S34 is affirmative. In this manner, a suitable load condition can be obtained.

Figure 11:
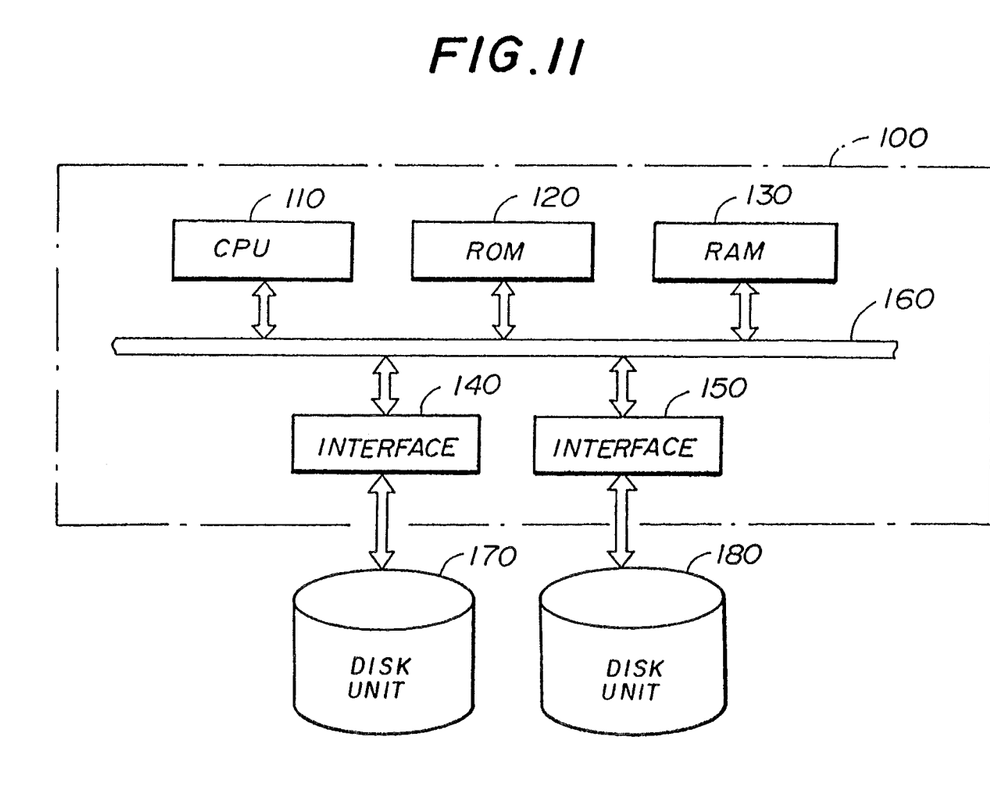
FIG. 11 is a block diagram of a circuit design support system according to the embodiment of the present invention.

FIG. 11 is a block diagram of a hardware structure of the circuit design support system. A computer 100 comprises a CPU 110, a ROM 120, a RAM 130, interface units 140 and 150, and a bus 160. Two disk units 170 and 180 are coupled to the bus via the interface units 140 and 150, respectively. Programs which define the above-mentioned processes are stored in the ROM 120. The CPU 110 operates in accordance with the programs stored in the ROM 120. Data indicating the functional specification of a desired circuit is stored in the disk unit 170, and data on a circuit configuration created by the present circuit design support system is stored in the disk unit 180.

The present invention is not limited to the specifically disclosed embodiments, and variations and modifications may be made without departing from the scope of the present invention.

What is claimed is:

1. A circuit design support system comprising:

logic minimizing means for receiving data indicating a functional specification of a desired circuit and for minimizing logical sequences of the desired circuit;

cell assignment means, operatively coupled to said logic minimizing means, for assigning cells to each of minimized logical sequences determined by said logic minimizing means and for generating data on a circuit configuration of the desired circuit;

load/timing check means, operatively coupled to said cell assignment means, for receiving the data on the circuit configuration and for simultaneously executing a load check and a timing check, said load check determining whether or not the circuit configuration has a load driving ability within a tolerable load driving ability, said timing check determining whether or not the circuit configuration has a delay time of a signal within a tolerable delay time, said load/timing signal check means comprising means for determining whether or not a signal output terminal in the circuit configuration has an overload and for calculating a delay time of a signal path including said signal output terminal assuming that a tolerable load is connected to said signal output terminal;

load adjustment means, operatively coupled to said load/timing check means, for executing a load adjustment of the circuit configuration on the basis of a result of the load check so that the load driving ability of said circuit configuration falls within the tolerable driving ability; and timing adjustment means, operatively coupled to said load/timing check means, for executing a timing adjustment of the circuit configuration on the basis of a result of the timing check so that the delay time of said circuit configuration falls within the tolerable delay time.

2. A circuit design support system as claimed in claim 1, wherein:

said load/timing check means comprises first means for identifying critical signal paths in the circuit configuration, said critical signal paths respectively having delay times exceeding the tolerable delay time; and said load adjustment means comprises second means for executing the load adjustment so that delay times of the critical signal paths are reduced.

3. A circuit design support system as claimed in claim 1, wherein:

said load/timing check means comprises first means for identifying critical signal paths in the circuit configuration, said critical signal paths respectively having delay times exceeding the tolerable delay time; and said load adjustment means comprises second means for inserting buffer elements in signal paths other than the critical signal paths so that so that delay times of the critical signal paths are reduced.

4. A circuit producing method comprising the steps of:
(a) receiving data indicating a functional specification of a desired circuit and minimizing logical sequences of the desired circuit;
(b) assigning cells to each of minimized logical sequences determined by said step (a) and generating data on a circuit configuration of the desired circuit;
(c) receiving the data on the circuit configuration and simultaneously executing a load check and a timing check, said load check determining whether or not the circuit configuration has a load driving ability within a tolerable load driving ability, said timing check determining whether or not the circuit configuration has a delay time of a signal within a tolerable delay time;
(d) executing a load adjustment of the circuit configuration on the basis of a result of the load check so that the load driving ability of said circuit configuration falls within the tolerable driving ability; and
(e) executing a timing adjustment of the circuit configuration on the basis of a result of the timing check so that the delay time of said circuit configuration falls within the tolerable delay time.

5. A method as claimed in claim 4, wherein said step (c) comprises the steps of:
determining whether or not a signal output terminal in the circuit configuration has an overload; and
calculating a delay time of a signal path including said signal output terminal assuming that a tolerable load is connected to said signal output terminal.

6. A method as claimed in claim 4, wherein:
said step (c) comprises the step of identifying critical signal paths in the circuit configuration, said critical signal paths respectively having delay times exceeding the tolerable delay time; and
said step (d) comprises the step of executing the load adjustment so that delay times of the critical signal paths are reduced.

7. A method as claimed in claim 4, wherein:
said step (c) comprises the step of identifying critical signal paths in the circuit configuration, said critical signal paths respectively having delay times exceeding the tolerable delay time; and
said step (d) comprises the step of inserting buffer elements in signal paths other than the critical signal paths so that so that delay times of the critical signal paths are reduced.

* * * * *